United States Patent
Kim et al.

(10) Patent No.: US 9,850,574 B2
(45) Date of Patent: Dec. 26, 2017

(54) FORMING A LOW-K DIELECTRIC LAYER WITH REDUCED DIELECTRIC CONSTANT AND STRENGTHENED MECHANICAL PROPERTIES

(71) Applicant: Applied Materials, Inc., Santa Clara, CA (US)

(72) Inventors: Taewan Kim, San Jose, CA (US); Kang Sub Yim, Palo Alto, CA (US); Alexandros T. Demos, Fremont, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 152 days.

(21) Appl. No.: 14/623,357

(22) Filed: Feb. 16, 2015

(65) Prior Publication Data
US 2015/0232992 A1 Aug. 20, 2015

Related U.S. Application Data

(60) Provisional application No. 61/941,400, filed on Feb. 18, 2014.

(51) Int. Cl.
| | |
|---|---|
| *C23C 16/30* | (2006.01) |
| *C23C 14/28* | (2006.01) |
| *C23C 16/40* | (2006.01) |
| *C23C 16/505* | (2006.01) |

(Continued)

(52) U.S. Cl.
CPC .......... *C23C 16/401* (2013.01); *C23C 16/505* (2013.01); *C23C 16/56* (2013.01); *H01L 21/0234* (2013.01); *H01L 21/02126* (2013.01); *H01L 21/02203* (2013.01); *H01L 21/02274* (2013.01); *H01L 21/02348* (2013.01)

(58) Field of Classification Search
CPC ..... C23C 16/32; C23C 16/325; C23C 16/401; C23C 14/28; H05H 1/24; B05D 3/06
See application file for complete search history.

(56) References Cited

U.S. PATENT DOCUMENTS

| | | | |
|---|---|---|---|
| 6,051,283 A | 4/2000 | Lee et al. | |
| 6,340,628 B1 * | 1/2002 | Van Cleemput | C23C 16/30 257/E21.277 |

(Continued)

OTHER PUBLICATIONS

Narisawa, Masaki, et al., "Evaluation of oxidation resistance of thin continuous silicon oxycarbide fiber derived from silicone resin with low carbon content". J. Mater. Sci. (2010) 45:5642-5648.*

(Continued)

*Primary Examiner* — Bret Chen
(74) *Attorney, Agent, or Firm* — Patterson + Sheridan, LLP

(57) ABSTRACT

A low-k dielectric porous silicon oxycarbon layer is formed within an integrated circuit. In one embodiment, a porogen and bulk layer containing silicon oxycarbon layer is deposited, the porogens are selectively removed from the formed layer without simultaneously cross-linking the bulk layer, and then the bulk layer material is cross-linked. In other embodiments, multiple silicon oxycarbon sublayers are deposited, porogens from each sub-layer are selectively removed without simultaneously cross-linking the bulk material of the sub-layer, and the sub-layers are cross-linked separately.

18 Claims, 8 Drawing Sheets

(51) Int. Cl.
*C23C 16/56* (2006.01)
*H01L 21/02* (2006.01)

(56) References Cited

U.S. PATENT DOCUMENTS

| | | | | |
|---|---|---|---|---|
| 6,627,532 | B1* | 9/2003 | Gaillard | C23C 16/401 257/E21.277 |
| 6,756,085 | B2* | 6/2004 | Waldfried | C09D 183/02 257/E21.26 |
| 6,949,830 | B2* | 9/2005 | Owada | H01L 21/02126 257/758 |
| 7,176,144 | B1 | 2/2007 | Wang et al. | |
| 7,892,985 | B1 | 2/2011 | Cho et al. | |
| 8,173,537 | B1* | 5/2012 | Chattopadhyay | H01L 21/6719 438/378 |
| 8,242,028 | B1* | 8/2012 | van Schravendijk | H01L 21/3105 257/E31.054 |
| 8,778,814 | B2* | 7/2014 | Owada | C23C 16/30 438/769 |
| 2004/0240820 | A1* | 12/2004 | Johnson | C03C 4/0042 385/129 |
| 2006/0043591 | A1 | 3/2006 | Yim et al. | |
| 2008/0107573 | A1* | 5/2008 | Schmitt | H01L 21/02126 422/198 |
| 2011/0006406 | A1* | 1/2011 | Urbanowicz | C23C 16/401 257/632 |
| 2012/0156890 | A1* | 6/2012 | Yim | H01L 21/02126 438/763 |
| 2012/0328886 | A1* | 12/2012 | Schmidt | C23C 28/044 428/428 |
| 2013/0029498 | A1 | 1/2013 | Nakano | |
| 2013/0177706 | A1 | 7/2013 | Baluja et al. | |
| 2013/0330935 | A1* | 12/2013 | Varadarajan | C23C 16/50 438/786 |

OTHER PUBLICATIONS

Xue, Kun, et al., "XPS Analysis of Silicon Oxycarbide Formed on the Surface of Rf-sputter Deposited SiC Thin Films". Key Engineering Materials, vols. 353-358, pp. 1871-1874. 2007.*
Smith, Ryan Scott, et al., "Analysis of Ultraviolet Curing Effect on the Dielectric Constant and Molecular Structure of a Porous Dielectric Film". Journal of Electronic Materials, vol. 39, No. 10, 2010.*
Narisawa, Masaki, et al., "Evaluation of oxidation resistance of thin continuous silicon oxycarbide fiber derived from silicon resin with low carbon content". J. Mater. Sci (2010) 45:5642-5648.*
Tsai, Tang-Yi, et al., "The effects of UV curing on silicon oxycarbide films". Optical and Quantum Electronics, Ausgabe Nov. 2016. Abstract Only.*
PCT Notification of Transmittal of the International Search Report and the Written Opinion of the International Searching Authority for International Application No. PCT/US2015/016012 dated May 26, 2015; 11 total pages.

* cited by examiner

FORMING A LOW-K DIELECTRIC LAYER WITH REDUCED DIELECTRIC CONSTANT AND STRENGTHENED MECHANICAL PROPERTIES

CROSS-REFERENCE TO RELATED APPLICATIONS

This application claims benefit of U.S. provisional patent application Ser. No. 61/941,400, filed Feb. 18, 2014, which is hereby incorporated herein by reference.

BACKGROUND

Field of the Invention

Embodiments of the present disclosure generally relate to the process of fabricating integrated circuits on substrates. More specifically, embodiments of the present disclosure describe processes and related apparatus for depositing low-k dielectric layers onto substrates for manufacturing integrated circuit devices.

Description of the Related Art

For decades, the semiconductor industry has worked toward producing integrated circuits (IC's) that are smaller, faster, and containing more devices than the IC's formed previously. Reduction of dielectric constants in low-k insulating materials is part of this effort. Low-k materials are typically considered those which have a dielectric constant, or k, of less than 4. The constant k is defined as the ratio of a material's permittivity compared to that of vacuum. Different approaches for reducing k have included using organic polymer materials, adding fluorine or carbon or other materials to silicon dioxide, and incorporating pores into dielectric layers.

One example of a material which combines two k-reducing strategies, a silicon oxide containing carbon and nanometer-scale pores, is Applied Materials' Black Diamond 3™ film. A starting layer can be deposited in a Black Diamond 3™ PECVD chamber, after which pores can be created by a curing treatment which removes porogens formed in a deposited layer. Pores can reduce the film's k value by as much as 30%. A typical curing treatment consists of exposing the deposited film to ultraviolet (UV) radiation and annealing. A curing process removes the porogen material to form empty pores while simultaneously cross-linking the bulk layer, but some of the remaining porogen material may be trapped in the bulk layer structure. During the cross-linking process, silicon-oxygen-silicon chains are formed, which creates a bulk-layer bonding structure and thus a mechanically strong layer. The cured Black Diamond 3™ layer's pores have a characteristic size distribution and are physically isolated so that the material remains sufficiently strong.

Porogens formed in the deposited layer occupy a volume in the formed layer which would otherwise be occupied by the bulk layer material. Porogens are typically selected from materials which can be decomposed into byproducts which can be removed by a conventional curing process in order to form a void or pore in the bulk layer material. Preferably the decomposed porogen material is diffused completely out of the layer, volatized, and removed from the processing region formed above the bulk layer.

Curing simultaneously cross-links or densifies the bulk layer and decomposes the material within pores, or porogens. As porogens are removed to form pores, the k value of the formed layer is decreased, and as the silicon bonds are cross-linked, the material becomes stronger. However, cross-linking also reduces the rate of diffusion of porogenic materials from the deposited layer. Therefore, as the cross-linking process is completed, any remaining porogens are trapped within the layer. Thus, longer curing times become ineffective in removing the porogens to form additional pores.

When the bulk layer material is completely cross-linked near the end of a curing process, remaining porogens are trapped within the bulk layer. It is believed that the remaining porogens can increase a film's dielectric constant, compared to a film not containing porogens at the end of a curing process. It is also believed that the remaining porogens may reduce a film's mechanical strength.

A porous dielectric layer's k value can be reduced simply by incorporating a larger volume percent of pores within a layer. However, higher porosity results in reduced mechanical strength. Thus, there is a tradeoff between a layer's low-k properties versus the layer's mechanical strength. For example, some low-k films require sufficient mechanical strength for surviving processes, such as chemical-mechanical polishing (CMP) processes that are typically performed on substrates that contain IC devices. CMP machines can apply large forces to the surface layers of a substrate, which can damage a mechanically weak layer.

Therefore there is a need for methods of forming dielectric layers which can have a reduced k value and have a desirable mechanical strength.

SUMMARY OF THE INVENTION

The present disclosure generally relates to dielectric layers used in integrated circuits. More specifically, the present disclosure describes a process and related apparatus for forming low-k dielectric layers which exhibit both improved dielectric properties (lower k) and have improved mechanical properties (greater hardness, improved mechanical strength and larger Young's modulus of elasticity).

In some embodiments of the present disclosure, a novel method for treating a porogenic dielectric layer is performed. This treatment can be used to selectively remove porogens before a cross-linking process is performed on the deposited layer. By first removing porogens, it is possible to separately cross-link the bulk film without trapping porogens in the pores formed in the originally deposited layer. By more completely emptying the pores, a lower k material is ultimately formed after performing the processes described herein. The removal of porogenic materials from the formed layer is also believed to form a mechanically stronger layer. The applicants have reduced to practice a number of embodiments which can both decrease a layer's k value and increase its mechanical strength, compared to conventional methods for curing deposited porogenic dielectric layers.

Embodiments of the disclosure may comprise a method for forming a low-k layer, comprising forming a silicon oxycarbon layer that includes a bulk material and a porogen material, exposing the formed silicon oxycarbon layer to a gas that comprises radicals, and exposing the formed silicon oxycarbon layer to an amount of energy after exposing the formed silicon oxycarbon layer to the radicals, wherein the amount of energy cures the formed silicon oxycarbon layer.

Embodiments of the disclosure may further comprise a method for forming a low-k layer, comprising forming a first silicon oxycarbon layer that comprises a bulk material and a porogen material, exposing the formed first silicon oxycarbon layer to a first gas that comprises radicals, forming a second silicon oxycarbon layer that comprises the bulk material and the porogen material on the first silicon oxycarbon layer, exposing the formed second silicon oxycarbon layer to a second gas that comprises radicals, and exposing the formed first and second silicon oxycarbon layers to an amount of energy, wherein the amount of energy cures the formed first and second silicon oxycarbon layer.

Embodiments of the disclosure may further comprise a method for forming a low-k layer, comprising forming a first silicon oxycarbon layer that comprises a bulk material and a porogen material, exposing the formed first silicon oxycarbon layer to a first gas that comprises radicals, exposing the formed first silicon oxycarbon layer to an amount of energy after exposing the formed first silicon oxycarbon layer to the radicals, wherein the amount of energy cures the formed first silicon oxycarbon layer, forming a second silicon oxycarbon layer that comprises the bulk material and the porogen material on the first silicon oxycarbon layer after exposing the formed first silicon oxycarbon layer to the amount of energy, exposing the formed second silicon oxycarbon layer to a second gas that comprises radicals, and exposing the formed second silicon oxycarbon layer to an amount of energy, wherein the amount of energy cures the formed second silicon oxycarbon layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

The present disclosure generally provides methods for forming a low-k dielectric layer within an integrated circuit (IC) device. However, it should be understood that the embodiments disclosed herein may have utility in system configurations other than those shown in the illustrative examples of the disclosure, and that these embodiments may also find applications which are not related to IC's, for example, micro-electro-mechanical systems (MEMS), displays and solar panels. Examples provided herein generally describe chemical vapor depositing and treating of low-k silicon-carbon oxide films, but the treating processes described herein can also be applied to porous low-k dielectric layers comprising other materials or produced by alternate means, such as spin-on glass (SOG).

Figure 1A:
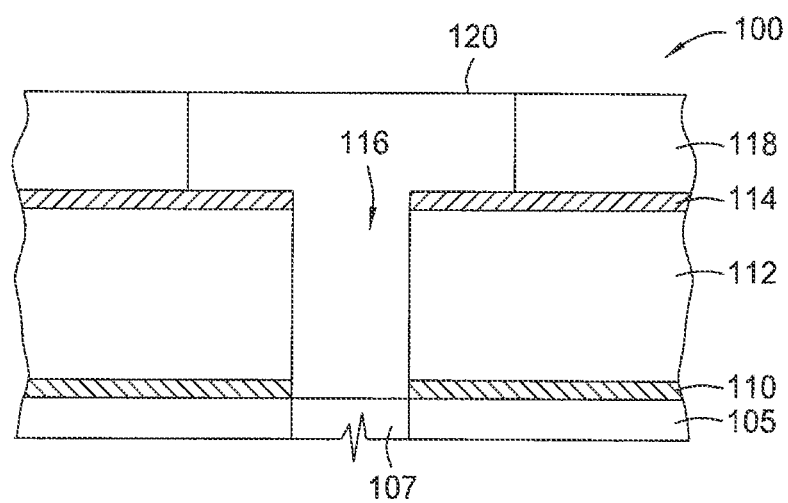
FIG. 1A is a cross-section of an integrated circuit (IC) substrate that has low-k dielectric layers formed therein, according to an embodiment of the invention.
Figure 1B:
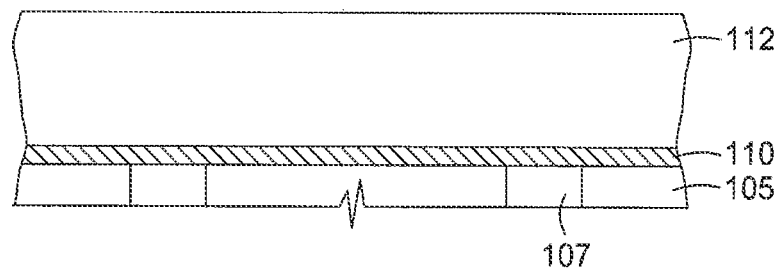
FIG. 1B is a cross-section of an IC substrate having a low-k dielectric layer formed therein, according to an embodiment of the invention.

An example of a damascene structure which can be formed using the low-k layers described herein is shown in FIGS. 1A and 1B. A dielectric barrier layer 110 is formed on the substrate surface to eliminate interlevel diffusion between the substrate and subsequently deposited materials. The dielectric barrier layer 110 may comprise materials such as oxygen doped silicon carbide or doped silicon nitride. The substrate surface may comprise metal features 107, such as copper features, formed in a dielectric material 105. A first low-k dielectric layer 112 is formed on the dielectric barrier layer 110. FIG. 1B shows unpatterned layers 110 and 112 on the substrate materials 105-107, while FIG. 1A illustrates these layers with further processing. Dielectric layer 112 can be a porous low-k silicon oxycarbon ($SiO_XC_Y$) layer as described herein.

A dielectric etch stop 114 of a silicon dielectric material, such as silicon nitride and/or oxygen doped silicon carbide, is then formed on the first dielectric layer 112. The etch stop 114 is then pattern etched using conventional techniques to define the openings 116 of the interconnects or contacts/vias. A second low-k dielectric layer 118 is then formed over the patterned etch stop layer. A resist is then deposited and patterned by conventional means known in the art to define the contacts/vias openings 116. A single etch process is then performed to define the contacts/vias openings 116 down to the etch stop and to etch the unprotected dielectric exposed by the patterned etch stop to define the contacts/vias openings 116. While not shown, an optional dielectric capping layer, similar to layers 110 and 114, may be formed on the second low-k dielectric layer 118. Low-k dielectric layer 118 can also be a porous low-k $SiO_XC_Y$ layer as described herein. Methods for lithographically patterning and etching as described can utilize processes which are conventional in the art.

One or more conductive materials 120 such as copper are then deposited to fill the formed contacts/vias openings 116. A blanket layer of conductive materials can be deposited and selectively removed by a planarization process which leaves only the materials, such as copper with a thin conducting liner-barrier layer conventional in the art, in the openings 116. A planarization process, or chemical-mechanical polishing (CMP) conventional in the art, can expose the low-k dielectric layers 112 and 118 to tremendous forces, which can damage them if the formed layers are weak. Thus IC designers may require that the low-k dielectric layers 112 and 118 have a high strength that is sufficient for withstanding CMP processing. The layers shown in FIG. 1 can be repeated to form an integrated stack of interconnecting metallization layers. For example, devices with over 9 layers of interconnected conducting paths are common. Other methods similar to the damascene sequence described can be utilized for forming interconnect layers, but which can also utilize low-k layers as described herein.

In this disclosure, the low-k silicon oxycarbon ($SiO_XC_Y$) film refers to layers of amorphous $SiO_XC_Y$, wherein the layer includes silicon (Si), oxygen (O), carbon (C), and X is typically between 0 and 2 and Y is typically between 0 and 1. However, in one embodiment, the low-k silicon oxycarbon ($SiO_XC_Y$) may be a hydrogenated amorphous $SiO_XC_Y$, or amorphous $SiO_XC_Y$:H, wherein the layer includes silicon (Si), oxygen (O), carbon (C), hydrogen (H), and X is typically between 0 and 2 and Y is typically between 0 and 1. ($SiO_XC_Y$) film refers to one or more layers of amorphous $SiO_XC_Y$, wherein the layer includes silicon (Si), oxygen (O), carbon (C), and X is typically between 0 and 2 and Y is typically between 0 and 1. However, in some cases, the low-k silicon oxycarbon ($SiO_XC_Y$) may be a hydrogenated amorphous $SiO_XC_Y$, or amorphous $SiO_XC_Y$:H, wherein the layer includes silicon (Si), oxygen (O), carbon (C), hydrogen (H), and X is typically between 0 and 2 and Y is typically between 0 and 1. The as deposited layer will also contain porogens and/or pores depending on the processing status of the formed layer. Porogens typically comprise precursors and precursor byproducts, but may include other materials. Silicon oxycarbon ($SiO_XC_Y$) type materials include organosilicon materials, carbon doped silicon oxide, oxygen-doped silicon carbide, and materials comprising silicon, oxygen, and carbon. The formed low-k film can also include other materials, such as fluorine (F), which can reduce k or provide other desirable film characteristics. A silicon oxycarbon film can include portions with separate doping levels or compositions, e.g. a nitrogen-containing lower portion of a film stack may function as a diffusion barrier. In some cases, the silicon oxycarbon layer may be amorphous, or crystalline, or amorphous with crystalline components. The surface of the layer may or may not contain a specific terminating bond structure, such as Si—$CH_3$. The low-k $SiO_XC_Y$ film can also include impurities from processing, such as those from chemical vapor depositing. In this disclosure, the terms "layer" and "film" are used interchangeably, and "partial layer" or "sublayer" interchangeably refer to a part of a layer. The term "substrate" may refer to materials, such as a blank or starting material such as a silicon wafer or a germanium wafer. In a production setting, a "substrate" is typically a processed wafer carrying partially formed integrated circuits.

Silicon Oxycarbon Layer Forming Apparatus

Figure 2:
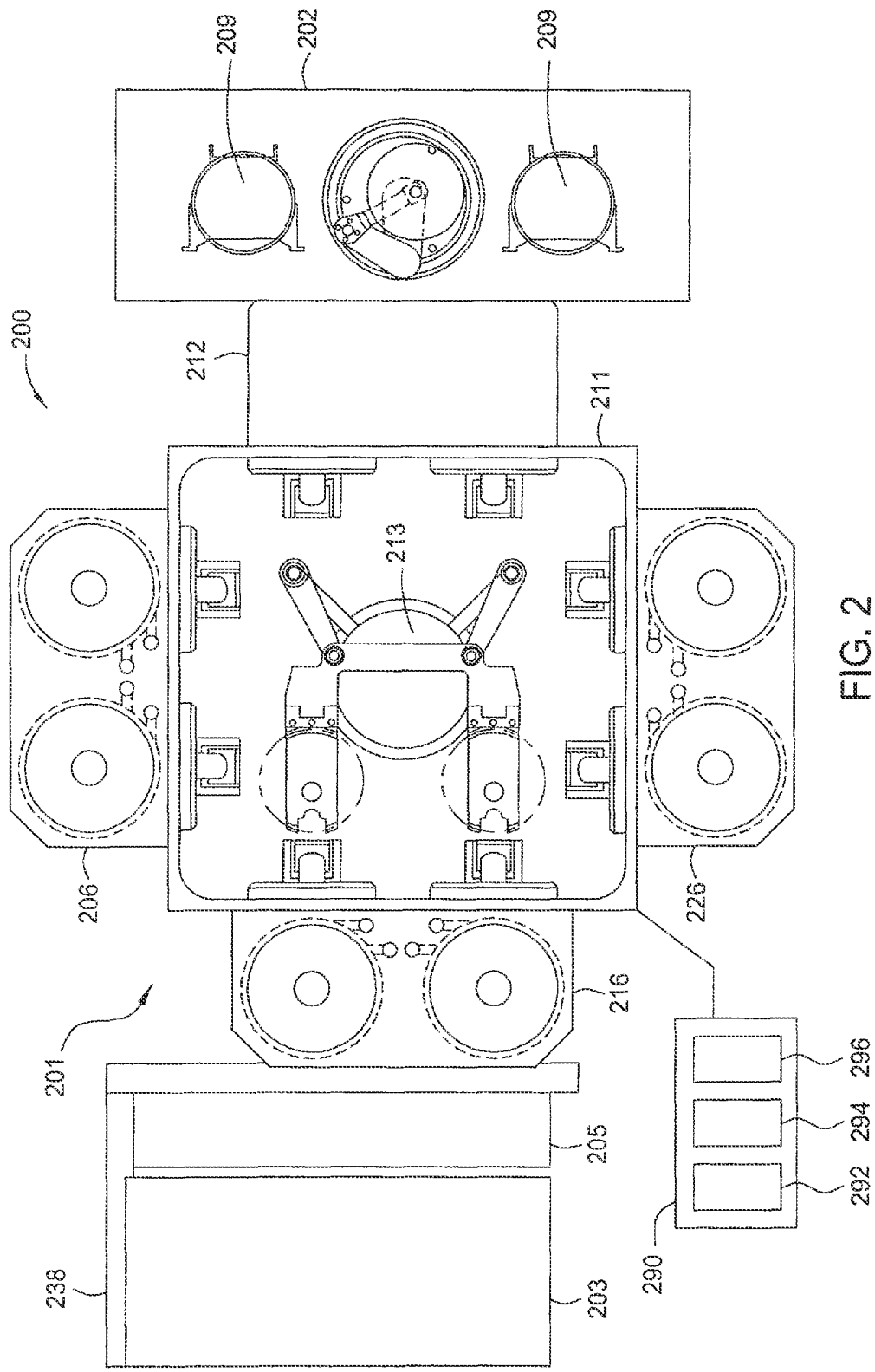
FIG. 2 is a schematic top view of for a cluster tool for forming a low-k dielectric layer, according to an embodiment of the invention.
Figure 3:
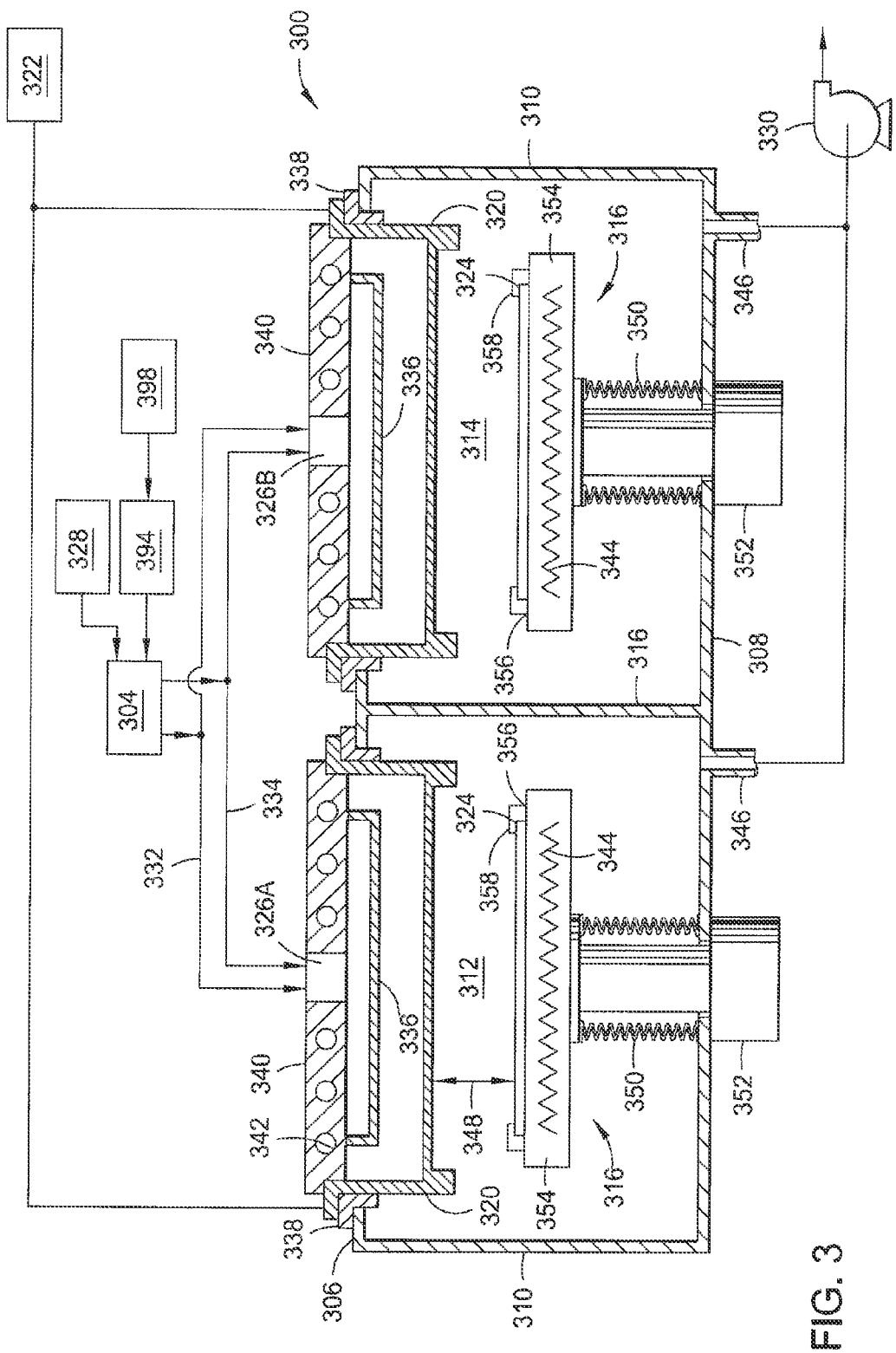
FIG. 3 is a cross-sectional illustration of a dielectric depositing chamber, according to an embodiment of the invention.
Figure 4:
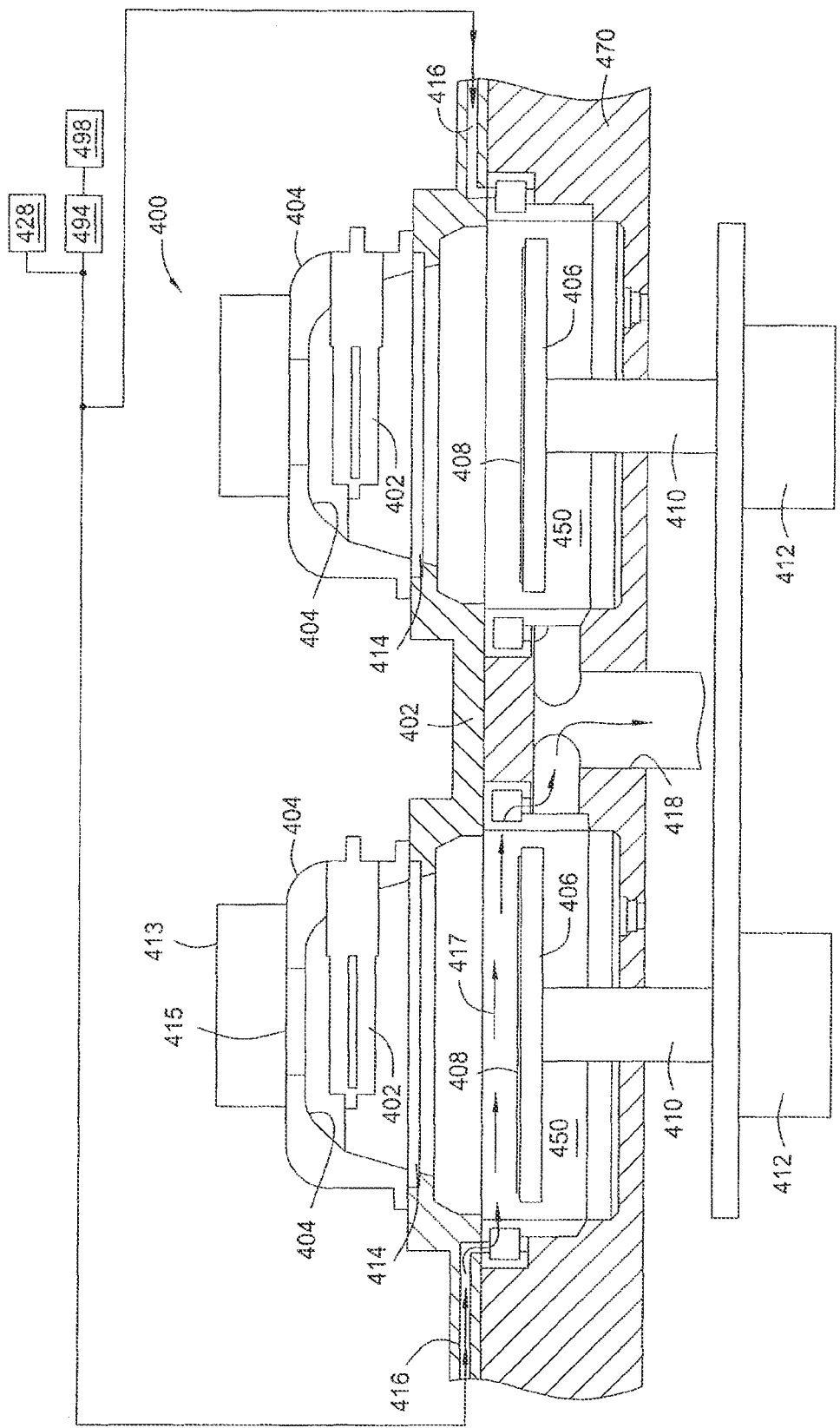
FIG. 4 is a cross-sectional illustration of a UV and thermal curing chamber, according to an embodiment of the invention.

FIGS. 2-4 illustrate apparatus for forming a low-k $SiO_XC_Y$ layer. FIG. 2 shows a plan view of a semiconductor processing system 200 in which embodiments of the invention may be incorporated. The system 200 illustrates one embodiment of a Producer™ processing system, commercially available from Applied Materials, Inc., of Santa Clara, Calif. The processing system 200 is a self-contained system having the necessary processing utilities supported on a mainframe structure 201. The processing system 200 generally includes a front end staging area 202 where substrate cassettes 209 are supported and substrates are loaded into and unloaded from a loadlock chamber 212, a transfer chamber 211 housing a substrate handler 213, a series of tandem process chambers 206, 216, and 226 mounted on the transfer chamber 211, and a back end 238 which houses the support utilities needed for operation of the system 200, such as a gas panel 203, and a power distribution panel 205. A controller 290 a contains computer and other circuitry for automation of tasks.

Each of the tandem process chambers 206, 216 and 226 includes two processing regions for processing the substrates (see FIGS. 3 and 4). The two processing regions share a common supply of gases, common pressure control and common process gas exhaust/pumping system. The arrangement and combination of chambers may be altered for purposes of performing specific process steps. Any of the tandem process chambers 206, 216, and 226 can contain processing hardware according to aspects of the invention as described below that includes an apparatus for chemical vapor depositing a porogen-containing low-k dielectric $SiO_XC_Y$ layer, an apparatus for exposing $SiO_XC_Y$ layers to radicals and/or plasma for selectively removing porogenic materials from the layers, and an apparatus which includes one or more ultraviolet (UV) lamps for use in a cross-linking process of a low k dielectric material on the substrate and/or in a chamber clean process.

In general, a system controller 290 may be used to control one or more components found in the substrate processing system 200. The system controller 290 is generally designed to facilitate the control and automation of the processing system 200 and typically includes a central processing unit (CPU) 292, memory 294, and support circuits 296. The CPU 292 may be one of any form of computer processors that are used in industrial settings for controlling various system functions, substrate movement, chamber processes, and support hardware (e.g., sensors, robots, motors, lamps, etc.), and monitor the processes (e.g., substrate support temperature, power source variables, gas flows, chamber pressure, chamber process time, I/O signals, etc.) The memory 294 is connected to the CPU 292, and may be one or more of a readily available type of a memory, such as random access memory (RAM), read only memory (ROM), floppy disk, hard disk, or any other form of digital storage, local or remote. Software instructions and data can be coded and stored within the memory 294 for instructing the CPU 292. The support circuits 296 are also connected to the CPU 292 for supporting the processor in a conventional manner. The support circuits 296 may include cache, power supplies, clock circuits, input/output circuitry, subsystems, and the like. A program (or computer instructions) readable by the system controller 290 determines which tasks are performable on a substrate. Preferably, the program is software readable by the system controller 290 that includes code to perform tasks relating to monitoring, execution and control of the movement, support, and/or positioning of a substrate along with the various process recipe tasks and various chamber process recipe steps being performed in the processing system 200. In one embodiment, the system controller 290 also contains a plurality of programmable logic controllers (PLC's) that are used to locally control one or more modules in the processing system 200, and a material handling system controller (e.g., PLC or standard computer) that deals with the higher level strategic movement, scheduling and running of the complete substrate processing system 200.

In one embodiment, a substrate can be provided to a cluster tool, such as that shown in FIG. 2, which is configured with processing chambers for in-situ PECVD depositing of dielectric films, exposing to radicals, and UV/thermal curing. In this example, the cluster tool is configured for simultaneously transporting and processing two substrates. Similarly, single-wafer cluster tools, such as the Endura® or Centura® systems manufactured by Applied Materials, can be utilized for transporting and processing a single substrate within any of a number of processing chambers installed on the systems. In one embodiment, chambers 206 and 216 are configured for pre-processing, PECVD depositing of porogenic low-k dielectric layers, and removing of porogens by exposing to radicals and plasma, while chambers 226 are configured to perform a cross-linking process, which may include delivering heat and/or UV wavelength energy to the substrate.

FIG. 3 depicts a chemical vapor processing chamber body 300 that includes a gas distribution system 304 coupled to a chamber body 300. In the embodiment depicted in FIG. 3, the tandem chamber body 300 includes a first processing region 312 and a second processing region 314. One processing chamber that may be adapted to benefit from the invention is a PRODUCER™ chemical vapor deposition system, available from Applied Materials, Inc.

A showerhead 320 is respectively disposed above each processing region 312, 314 of the chamber body 300 to provide uniform distribution of gas within the chambers. The showerhead 320 enables in-situ deposition of dielectric films. The showerhead 320 is also useful in other processes where uniform gas distribution is desired, such as in-situ treating a dielectric film with radicals or with plasma.

The exemplary chamber body 300 generally comprises a lid 306, a bottom 308 and sidewalls 310. At least one interior wall 316 is disposed between the lid 306 and bottom 308 of the chamber body 300 to separate the first processing region 312 from the second processing region 314. Exhaust ports 346 disposed in the chamber body 300 generally couple the processing regions 312, 314 to a vacuum pump 330. A throttle valve (not shown) is generally disposed between the pump 330 and each exhaust port 346 and is utilized to regulate pressure in the processing regions 312, 314.

Each processing region 312 and 314 includes a substrate support 354. The substrate support 354 supports a substrate 324 during processing. The substrate support 354 may retain the substrate 324 by a variety of methods, including electrostatic attraction, vacuum or mechanical clamping. Each substrate support 354 is coupled to a lift mechanism 352 that controls the elevation of the substrate support 354 relative to the showerhead 320. The substrate support 354 may be lowered by the lift mechanism 352 to facilitate substrate transfer through substrate access ports (not shown) disposed in the sidewalls 310. Conversely, the substrate support 354 may be raised towards the showerhead 320 to set a gap (or spacing) 348 between the substrate 324 and the showerhead 320. Bellows 350 are coupled between the lift mechanism 352 and the chamber bottom 308 to prevent vacuum leakage.

The substrate support 354 includes a heating element 344 utilized to thermally control the temperature of a substrate 324. The heating element 344 may be a resistive heater, a fluid conduit for flowing a heat transfer fluid or a thermoelectric device among other temperature control devices. In the embodiment depicted, the heating element 344 is a resistive heater capable of heating and maintaining the substrate 324 at a temperature of about 200° C. to about 450° C.

Gas boxes 340 are disposed in the lid 306 of the chamber body 300 over the substrate support 354 disposed in processing region 312, 314. The gas box 340 may include one or more passages 342 at least partially formed therein to facilitate thermal control of the gas box 340. Each gas box 340 is coupled to the gas distribution system 304. The gas distribution system 304 includes at least a first gas supply circuit 332 and a second gas supply circuit 334. The first gas supply circuit 332 provides at least a first process gas to each processing region 312, 314. The first gas supply circuit 332 is respectively coupled to a first and a second mixing blocks 326A, 326B disposed in the lid 306 of the chamber body 300. The second gas supply circuit 334 is generally coupled to the first and second mixing blocks 326A, 326B and provides a second process gas thereto. A gas source 328 is coupled directly to the gas distribution system 304. Gas source 328 can be a bottle or bottles of high purity gasses such as oxygen ($O_2$), nitrogen ($N_2$), or hydrogen ($H_2$). A gas source 328 may also include a large-molecular precursor source or bubbler, wherein the precursor is liquid at room temperature and requires a heated line and a "push" gas for reliable flow to the substrates 324. Gas source 328 can also be a network of connections to a common factory building facility which is configured to provide delivery of high purity gases from a common gas source to individual processing systems. A second gas source 398 is similar to gas source 328 but is coupled to a remote plasma source (RPS) 394. RPS 394 is configured to dissociate molecular species of gases flowing through the RPS by delivering energy to these flowing gases by use of an energy source (not shown) (e.g., microwave, RF or high voltage source). One example of an RPS is Applied Materials' Remote Plasma Source hardware which can be coupled to chambers in order to deliver radicals to substrate surfaces. RPS 394 is coupled to gas distribution system 304 to provide delivery of radicals to substrates 324.

One embodiment of delivering radicals for treating a low-k silicon oxycarbon layer is described below. In this embodiment, a layer is exposed to radicals for removing porogenic materials, or porogen containing materials, from pores without cross-linking or densifying the surrounding layer. In one embodiment, the exposing to radicals is performed in a PECVD chamber such as chambers 300.

The blocker plate 336 is coupled to the lid 306 of the chamber body 300 and forms the first plenum therewith below each mixing block 326A, 326B. The blocker plate 336 is generally perforated to distribute the gases flowing out each mixing block 326A, 326B radially.

The showerhead 320 is generally coupled to the lid 306 of the chamber body 300 between each blocker plate 336 and substrate support 354. The showerhead 320 generally distributes process and other gases uniformly to the processing regions 312, 314 to enhance deposition uniformity. A radio frequency (RF) power source 322 is coupled to the showerhead 320. RF power, applied to the showerhead 320 during processing, typically ignites and sustains a plasma of the mixed process gas(es) and/or other gases within the respective processing regions 312, 314 which generally facilitates lower processing temperatures with increased deposition rates. A dielectric isolator 338 disposed between the showerhead 320 and the lid 306 of the chamber body 300 is used to electrically isolate the RF hot showerhead 320 from the chamber body 300. In one embodiment, endpoint detection hardware, such as a spectrometer optically coupled to chambers 300 through an optical fiber, can detect the presence or absence of porogen byproducts in a plasma during a plasma treatment used to remove porogens from the formed layer.

FIG. 4 shows a partial cross section view of a tandem process chamber 400 for cross-linking a $SiO_xC_y$ film, with housings 404 and power sources (not shown). Each of the housings 404 cover a respective one of two UV lamp bulbs 402 disposed respectively above two processing regions 450 defined within the body 470. Each of the processing regions 450 includes a heating substrate support 406 for supporting a substrate 408 within the processing regions 450. The substrate supports 406 can be made from ceramic or metal such as aluminum. Preferably, the substrate supports 406 couple to stems 410 that extend through a bottom of the body 470 and are operated by drive systems 412 to move the substrate supports 406 in the processing regions 450 toward and away from the UV lamp bulbs 402. The drive systems 412 can also rotate and/or translate the substrate supports 406 during curing to further enhance uniformity of substrate illumination. Adjustable positioning of the substrate supports 406 can enable control of the generation of the volatile cure by-product and control of the purge and clean gas flow patterns and residence times, while also potentially fine tuning the incident UV irradiance levels on the substrate 408 depending on the nature of the light delivery system. In one embodiment, RF power is supplied from a power source (not shown) to the substrate supports 406 for forming plasma in the processing regions 450.

UV light emitted from the UV lamp bulbs 402 enters the processing regions 450 by passing through windows 414 disposed in apertures in the lid 402. The windows 414 preferably are made of a synthetic quartz glass and have sufficient thickness to maintain vacuum without cracking. Further, the windows 414 are preferably fused silica that transmits UV light down to approximately 150 nm. Since the lid 402 seals to the body 470 and the windows 414 are sealed to the lid 402, the processing regions 450 provide volumes capable of maintaining pressures from approximately 1 Torr to approximately 650 Torr. Processing or cleaning gases enter the processing regions 450 via a respective one of two inlet passages 416. The processing or cleaning gases then exit the processing regions 450 via a common outlet port 418.

Processing gasses entering inlet passages 416 can include both gases and radicals. A gas source 428 is coupled directly to the inlet passages 416. Gas source 428 can be a bottle or bottles of high purity gases such as oxygen ($O_2$), nitrogen ($N_2$), ammonia ($NH_3$) or hydrogen ($H_2$). Gas source 428 can also comprise connections to factory building facility configured to provide delivery of high purity gases from a common gas source to a plurality of processing systems. A second gas source 498 is similar to gas source 428 in description but is coupled to a remote plasma source (RPS) 494. RPS 494 is configured to dissociate molecular species of gases flowing through the RPS. The RPS 494 is coupled to the gas inlet 416 to provide delivery of radicals to substrates 408.

In an embodiment, the radicals from the RPS 494 and gases from a gas source 428 enter the processing regions 450 so that the radicals and/or plasma can react with porogenic materials contained inside of pores in the deposited low-k dielectric layer prior to performing a curing process. In one embodiment, the exposing to radicals and/or plasma precedes a separate curing step. In one such embodiment, the exposing to radicals and/or plasma is performed in a chamber which is configured for performing a curing process. After selectively exposing the surface of a substrate to a flow of radicals, UV light and heat can be applied for curing the layer, in which silicon atoms form bonds with oxygen atoms and other atoms in the layer, thus cross-linking and/or densifying the layer.

Silicon Oxycarbon Layer Formation and Processing Examples

Figure 5:
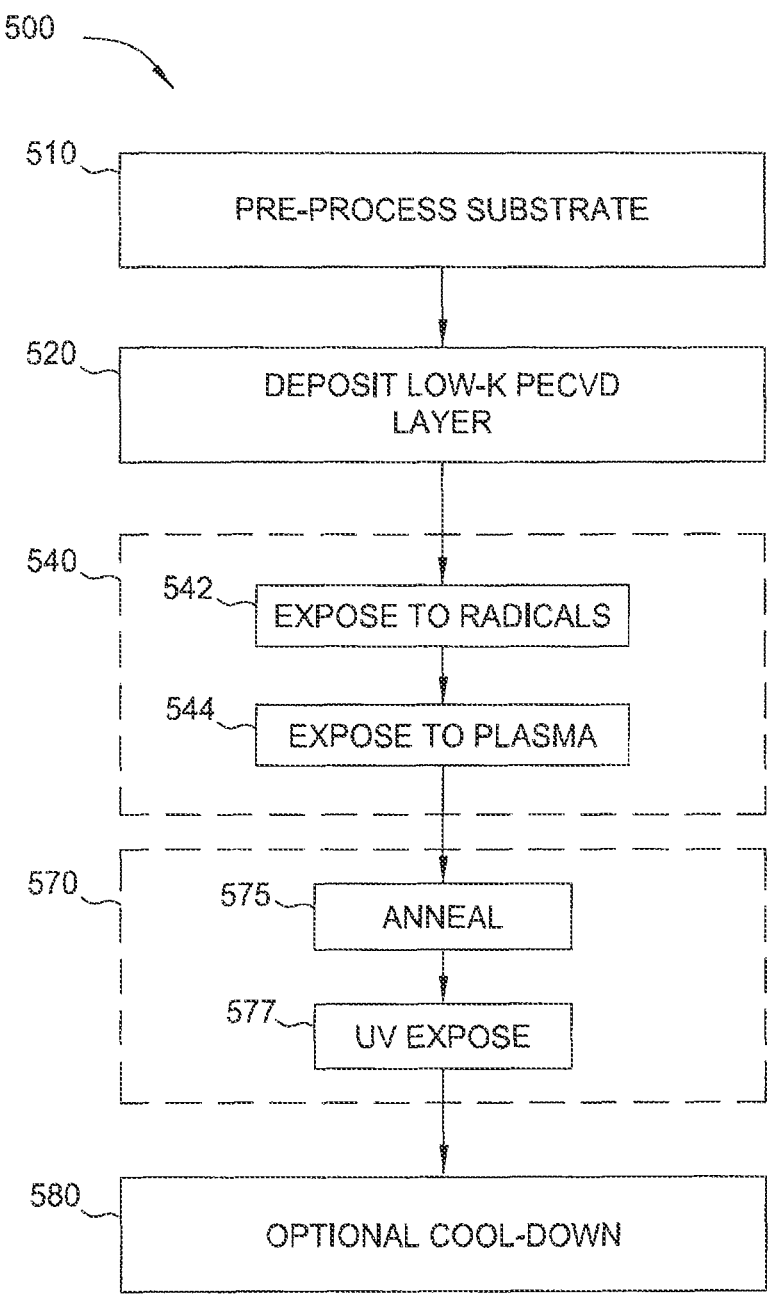
FIG. 5 is a flowchart illustrating one embodiment of a process for forming low-k dielectric layers, according to an embodiment of the invention.
Figure 6A:
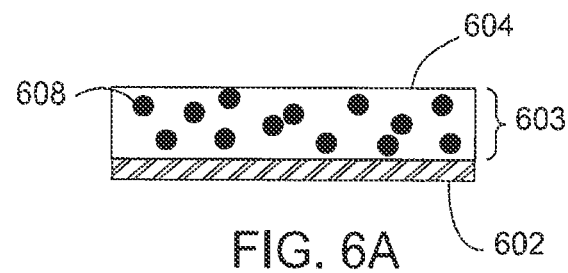
FIG. 6A is a cross-section of an as deposited low-k $SiO_XC_Y$ layer that contains porogens, according to an embodiment of the invention.
Figure 6B:
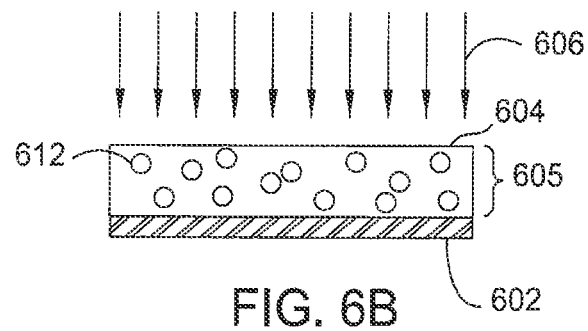
FIG. 6B is a cross-section of a porous low-k $SiO_XC_Y$ layer from which the porogens have been removed to form the pores in the layer, according to an embodiment of the invention.
Figure 6C:
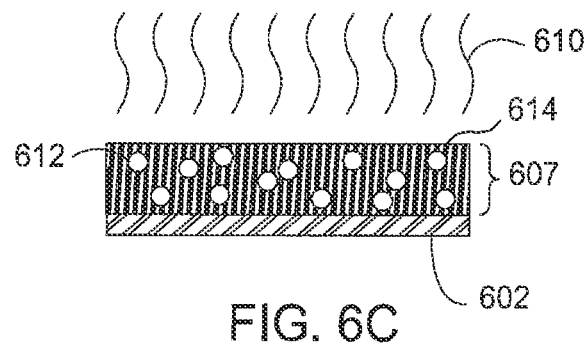
FIG. 6C is a cross-section of a cross-linked porous low-k $SiO_XC_Y$ layer, according to an embodiment of the invention.
Figure 7:
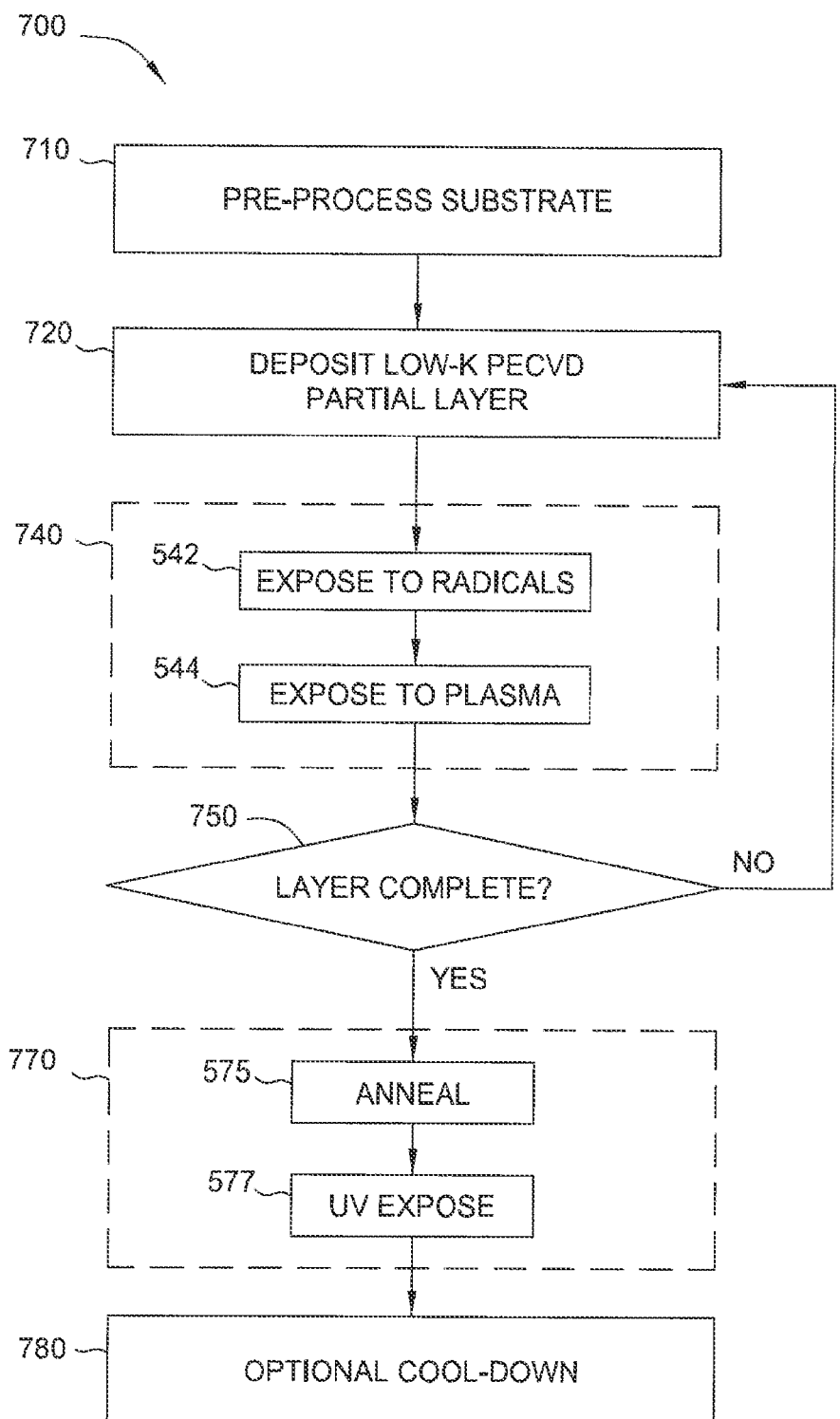
FIG. 7 is a flowchart illustrating a process for forming reduced-k dielectric films, according to an embodiment of the invention.
Figure 8:
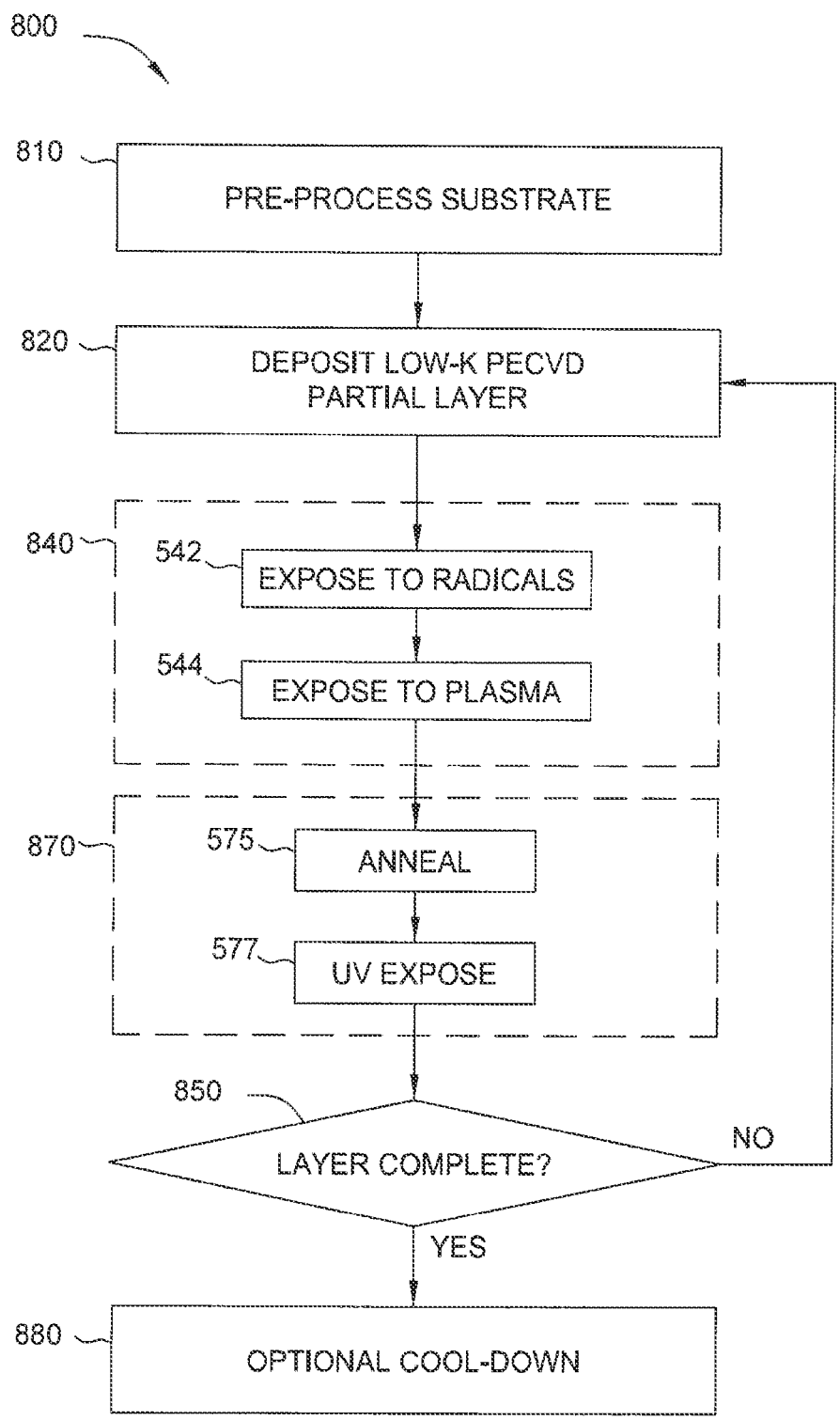
FIG. 8 is a flowchart illustrating a second embodiment of a process for forming reduced-k dielectric films, according to an embodiment of the invention.

FIGS. 5, 7, and 8 illustrate process sequences for forming a low-k $SiO_XC_Y$ layer, while FIGS. 6A-6C illustrate a substrate during different parts of a layer formation sequence, such as parts of the process sequence 500 illustrated in FIG. 5. Each of the process sequences 500, 700 or 800 describe steps for depositing a porogenic layer, selectively removing porogens from pores formed in the bulk layer, and cross-linking the remaining porous bulk layer.

FIG. 5 is a process flow diagram of a process sequence 500 used to form a low-k $SiO_XC_Y$ layer, which may be used to form a part of an integrated circuit. Although the order of the steps can be changed, the order of the steps as shown in FIG. 5 include a pre-process step 510, a low-k layer deposit step 520, a treatment step 540, a cross-linking step 570, and an optional cooldown step 580. The steps 540 and 570 may include one or more sub-steps, which are described below.

At the start of process sequence 500, a substrate is introduced to a cluster tool system's vacuum environment through a loadlock. Next, during the pre-process step 510 the substrate may be heated, outgassed, and/or precleaned using a plasma in a chamber in the processing system (e.g., processing system 200). The pre-processing step can be used to prepare the substrate for a chemical vapor deposition process. In particular, heating helps to remove water vapor adsorbed from exposing the substrate to atmospheric humidity. Heating can also raise the temperature of a substrate to a desired chemical vapor depositing temperature. In some cases, a precleaning step can be performed by exposing the surface of the substrate to a plasma.

Next, at step 520, a porogen containing low-k dielectric layer, such as layer 603 (FIG. 6A) is deposited. Different methods for depositing a porogenic low-k dielectric layer may include CVD, PECVD, physical vapor deposition (PVD), atomic layer deposition (ALD), and spin-on glass (SOG) processes. FIG. 6A depicts a substrate 602 with a layer 603, such as a porogen containing $SiO_XC_Y$ or organosilicon layer, formed thereon during the low-k layer deposit step 520. The substrate 602 can be, among others, a thin sheet of metal, plastic, organic material, silicon, glass, quartz, or polymer materials. In one embodiment, the substrate 602 is a silicon containing substrate upon which a silicon-containing layer will be deposited. In other embodiments, the substrate 602 may be a non-doped, doped or otherwise modified glass substrate. A typical IC substrate will also include a number of patterned layers and formed or partially formed parts of IC's.

In one embodiment, the deposited layer 603 is formed by use of a plasma enhanced chemical vapor deposition (PECVD) process to form a porogen 608 containing bulk layer 604. Porogens can be formed within the layer from precursors and reactants trapped within the deposited film. Porogens can be formed from large-molecule precursors and their byproducts. Examples of low-k $SiO_XC_Y$ layers known in the art include Applied Materials' Black Diamond 2™ and Black Diamond 3™ films. Low-k dielectric films can be deposited in PECVD chambers such as that described above (FIG. 3) or in chambers such as Applied Materials' HDP-CVD chamber, which uses three different RF power sources for separately powering the substrate support, the showerhead, and an inductive coil. In a typical PECVD depositing step 520, an organic silane (silicon containing) type gas is flowed into the process chamber along with non-silane gases. Many such silane gases are known in the art. A silane gas or mixture of silane gases concentration, deposition temperature, deposition process pressure and RF power level can be adjusted to form a desired pore size in the deposited film. Generally, larger silane precursor molecules form larger porogens within the film.

PECVD silicon-containing precursors can include one or more precursors selected from the group consisting of diethoxymethylsilane, dimethoxymethylsilane, di-isopropoxymethylsilane, di-t-butoxymethylsilane, methyltriethoxysilane, methyltrimethoxysilane, methyltri-isopropoxysilane, methyltri-t-butoxysilane, dimethyldimethoxysilane, dimethyldiethoxysilane, dimethyldi-isopropoxysilane, dimethyldi-t-butoxysilane, and tetraethoxysilane, trimethylsilane, tetramethylsilane, methyltriacetoxysilane, methyldiacetoxysilane, methylethoxydi-siloxane, tetramethylcyclotetrasiloxane, octamethylcyclo-tetrasiloxane, dimethyldiacetoxysilane, bis(trimethoxysilyl)methane, bis(dimethoxysilyl)-methane, tetraethoxysilane, triethoxysilane, and mixtures thereof.

As noted above, the bulk layer 604 may include silicon, oxygen and/or carbon atoms. In one example, the bulk layer 604 is a $SiO_XC_Y$ containing layer, in which X is typically between 0 and 2 and Y is a number between 0 and 1. In some cases, the $SiO_XC_Y$ containing layer may also include hydrogen. In one embodiment, the $SiO_XC_Y$ layer can further comprise fluorine. The $SiO_XC_Y$ layer is generally deposited by CVD, such as PECVD. However, the deposition technique used to deposit the layer is not intended to be limiting. The ratio and structural arrangement of carbon, silicon, oxygen, fluorine, and hydrogen atoms in the deposited bulk layer 604 is dependent on the precursors chosen, the oxidant, and the CVD process conditions, such as RF power, gas flow, residence time, and substrate temperature.

As illustrated in FIG. 6A, the porogens 608 occupy a volume in the layer 603 which would otherwise be occupied by the bulk layer 604. Pores 612 (FIG. 6B) are formed by removing the porogens 608 from the formed layer 603. The porogens 608 are typically randomly embedded within the bulk layer, however this arrangement is not intended to be limiting. For example, the $SiO_XC_Y$ layer can comprise sub-layers with different material properties, and the porogen density could be higher at the middle of the layer compared to the top and bottom of the film. In some cases, the porogen 608 may be a discrete component of the bulk layer or may be a portion of a molecule which forms the bulk layer 604, for example, a —$CH_2$ group attached to a silicon atom. A porogen 608 is typically a molecule or molecular part of a precursor gas (or gases) embedded in a chemical vapor deposited $SiO_XC_Y$ layer during layer growth.

Porogens 608 can be formed in the layer by adding a flow of non-silicon-containing large-molecular organic precursors to the silane flows, as described above. Examples of non-silicon-containing precursors include vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, 1,4-dioxin, fluorinated derivatives thereof, and combinations thereof.

Next, during step 540, the porogens 608 are removed from the formed layer 603, due to their chemical decomposition during this step, so that the decomposed porogen material can diffuse out of the pore 612, formed in the layer, and ideally out of the surface of the layer. In one embodiment of step 540, porogens 608 are decomposed by exposing the deposited layer to radicals, or a radical containing gas. In another embodiment, the porogens are decomposed by exposing the surface of the substrate to a plasma formed over a surface of the deposited layer. Step 540 may include the use of an oxidizing gas or a reducing gas.

In one embodiment of step 540, nearly all decomposable porogens 608 are removed from the pores 612 prior to performing step 570. FIG. 6B illustrates a treated $SiO_XC_Y$ layer, or treated layer 605, that is formed at the completion of step 540. In one embodiment of step 540, the formed layer 605 is not cross-linked during the porogen decomposition and porogen diffusion process, so that a complete emptying of pores 612 can be achieved and substantially only the bulk layer 604 remains. In another embodiment, the porogenic layer treatment step 540 not only empties pores 612 of porogens 608, but also selectively removes non-$CH_3$ surface terminating groups while leaving —$CH_3$ surface terminating groups intact within the layer and on its surfaces. A formed porogenic layer can thus become more porous through a process which selectively removes porogen material prior to the cross-linking process (e.g., step 570).

In one example, the treatment step 540 includes an exposure to radicals step 542 and/or an exposure to plasma step 544. Exposing a porogenic layer to radicals and/or a plasma can cause a decomposition and removal of the porogenic materials from the deposited low-k $SiO_XC_Y$ layer. The decomposition and removal process can be performed without cross-linking, or causing bonding of the silicon atoms to adjacent atoms or molecules found within the bulk layer 604. It is believed that diffusion of the porogenic byproducts, from pores within the formed layer, can proceed at a much more desirable rate when cross-linking step does not simultaneously occur. Therefore, processes that can cause the decomposition and diffusion of the porogens from the formed layer, without cross-linking, as described herein, can remove a greater proportion of porogenic material than processes which simultaneously remove porogens while cross-linking. The treatment step, or step 540, may include more than one treatment steps, each of which can separately performed.

In one embodiment, a porogen 608 containing dielectric layer is exposed to radicals and/or plasma to empty pores 612 without cross-linking, then separately the bulk layer 604 is cross-linked. In another embodiment, exposing a porogen containing layer 603 to radicals and/or plasma selectively removes surface terminating groups —$CH_1$, —$CH_2$, and other hydrocarbon groups while not removing the —$CH_3$ surface terminating groups. The applicants believe that the observed reductions in k value and increases in mechanical strength, are due to an improved ability to empty the pores 612 of the porogens 608. The emptying of the pores 612 can also result in reduced levels of non-$CH_3$ carbon groups within the final $SiO_XC_Y$ layer. However, the observations described herein can be explained in a number of different ways, thus the theories and language selected herein are not to be considered as limiting.

Gases utilized for removing porogens 608 can include oxidizing gases such as oxygen ($O_2$), ozone ($O_3$), nitrous oxide ($N_2O$) and water vapor ($H_2O$), and can additionally include hydrogen ($H_2$), methane ($CH_4$), carbon dioxide ($CO_2$), and inert gases such as nitrogen ($N_2$), argon (Ar), and helium (He). The porogen removing gases can be delivered in a combination of radicals, non-radical gas mixtures, and plasma. Typical chamber pressures during step 540 are in the range of 0.01 Torr to 10 Torr. Typical substrate temperatures during step 540 may be in the range of 150° C. to 400° C. The power delivered to the process gases by an RPS, which is used to enhance the process performed in step 540, may be in the range between 3 W and 2000 W. RPS power may vary depending on the type of RPS hardware, the RPS and chamber configuration, the recombination rate of gases delivered to the surface of the substrate, the flow of noble gases (for which a radical is the same as a non-radical gas atom), and the area of the substrate. In one example, step 540 includes 2 process steps, such as a first process step that includes a 90 second gas flow of oxygen and argon through an RPS that provides 50 W of RF power to the flowing gas that is delivered into a processing region of a process chamber that is maintained at a process pressure of 2 Torr, while the substrate holder is maintained at a temperature of 300° C. Then a second step that may include a 40 second gas flow of helium and hydrogen through the RPS that provides 50 W of RF power to the flowing gas that is delivered into the processing region of the process chamber that is maintained at a pressure of 2 Torr, while a plasma is also formed within the processing region by delivering an RF power of 200 W within the processing chamber. Alternately, in one embodiment, a low level of UV illumination is used to assist the formation of gas radicals at the surface of the low-k layer.

Step 540 can be performed to a the layer 605 while it is disposed in a PECVD chamber, in a dedicated pore-forming chamber, or in a cross-linking chamber, such as a Nanocure™ 3 chamber manufactured by Applied Materials. In one embodiment, step 540 is performed in-situ following a step 520.

Next, at step 570, a cross-linking process is performed on the bulk layer 604. In one example, step 570 may include an annealing step 575 and/or UV exposing step 577. In one embodiment, the annealing and UV exposing steps are utilized to cross-link the bulk layer 604 after the porogens 608 have been selectively removed from the layer. In step 570, Si—O—Si chains are formed from repeating Si—O segments found in the treated bulk layer 614. It is generally believed that the processes described herein will tend to minimize the formation of Si—C bonds, the removal of the unwanted porogen material and other hydrocarbon materials during the processes described herein. In some cases, Si—CH$_3$ bonds (and Si bonds to other atoms or groups) can be formed at the same time. It is believed that due to the low level of porogen material found in the treated bulk layer 614 after performing step 540 will result in improved cross-linking within the layer, thus forming a lower k material which is also mechanically stronger. The treated bulk layer 614 will also typically include a layer that has fewer silicon atoms bonded to non-CH$_3$ groups materials. Cross-linking can be performed in a single-chamber (or tandem chamber) process. One example of hardware known in the art used for cross-linking is Applied Materials' Nanocure™ 3 chamber. Cross-linking processes may be similar to conventional curing processes for Black Diamond 2 and 3™ films.

FIG. 6C depicts a substrate 602 having the treated bulk layer 614 that has a plurality of pores 612 formed therein. The cross-linking treatment performed in step 570 creates a treated bulk layer 614, which is believed to have improved mechanical strength over a conventionally cured film. Some cross-linking treatments are conventional in the art, such as those which utilize a combination of UV and annealing for cross-linking and curing Black Diamond 3™ films in an Applied Materials' Nanocure™ 3 chamber.

Step 580 is an optional cool-down step, wherein a substrate is cooled prior to being transported from the processing system. In one embodiment, the process sequence 500 is performed in-situ by use of a processing system configured for PECVD processing, exposing to radicals, and curing.

In various experiments, the process sequence 500, wherein porogens are removed prior to cross-linking, is used to form a low-k layer has both a lower k and an increased mechanical strength compared to processes in which porogen removal and cross-linking are simultaneously performed. In one example, a Black Diamond® film exhibited a dielectric constant k which was 0.05 less and a Young's Modulus that was 20% higher. Similar improved film characteristics were observed for 7 other evaluated types of SiO$_X$C$_Y$ films.

Low-k dielectric layers can exceed a removal thickness, or thickness through which porogenic materials can be removed by a process such as process step 540. The removal thickness can depend of factors such as dielectric bulk material properties, porosity, porogenic material properties, and process conditions in a process step 540. Low-k dielectric layers are typically 200 nm to 1000 nm thick, whereas removal thicknesses measured to date are in the 40 nm to 150 nm range. Thus, it is possible that thick layers, deposited using a process sequence 500, will contain porogens at depths greater than the removal depth. However, by separately depositing and removing porogens from a sequence of thin sub-layers, whose thicknesses are less than or equal to the removal thickness, thick porogen-free low-k layers can be formed.

FIG. 7 illustrates a multi-step process sequence 700 for forming a low-k SiO$_X$C$_Y$ layer by forming multiple partial layers, or sub-layers. In the process sequence 700, a substrate can be pre-processed by use of step 710, which may be similar to the step 510 described above. A partial layer of porogen containing SiO$_X$C$_Y$ can be deposited in a step 720, which may be similar to a step 520 described above, which is used to deposit a complete layer of a porogen containing SiO$_X$C$_Y$ layer. The formed partial layer can then be treated in a step 740 to remove the formed porogens, which may be similar to the step 540 described above, by exposing the deposited film to radicals (step 542) and/or exposing the layer to a plasma (step 544). If the formed layer is a desirable thickness, in step 750, the total layer is treated in a step 770, which may be similar to the step 570 described above. However, if the layer is not at a desired thickness, the process steps 720-750 are repeated, wherein another partial layer is deposited and treated to remove the porogens 608, and step 750 is repeated as shown FIG. 7.

The process sequence 700 for achieving a lower dielectric constant k may be useful, where the diffusion lengths for radicals and plasma active bombarding species into the deposited film is shorter than the desired film thickness (e.g., complete low-k film layer thickness) and/or the diffusion lengths for porogenic byproducts are shorter than the thickness of the desired film layer. By depositing and treating sub-layers that have less than the complete desired thickness, a greater proportion of porogen material found in the as-deposited film (e.g., deposited layer 603) can be removed from each of these sub-layers. In one experiment the applicants were able to remove a substantial percentage of porogen byproducts from the top 500 Angstroms (Å) of the layer, but much less from deeper in the deposited layer. Therefore, in one example of the process sequence 700, a 1 μm low-k dielectric layer is formed by depositing and treating 20 sub-layers that each have a 500 Å thickness, prior to performing the cross-linking step 770. In a preferred embodiment, the depositing step 720 and the treating step 740 are performed within a singular PECVD chamber for a higher processing throughput. A cooldown step 780 is similar to the cooldown step 580 described above.

FIG. 8 illustrates a process sequence 800 for depositing a low-k dielectric layer using partial layers or sub-layers. In the process sequence 800, a substrate is pre-processed in a step 810, which is similar to the steps 510 and 710 described above. Next, in step 820, a partial layer is deposited (similar in description to step 720), then the deposited layer is treated (step 840 which is similar in description to step 540) to remove porogens, and the layer is cross-linked in a step 870

(similar in description to step 570 described above). The steps 820-840-870 are repeated until a complete layer is deposited. If the layer is a desirable thickness, in step 850, steps 820-840-870 are not repeated. An optional cooldown step 880, which is similar in description to step 580, may then be performed. The difference between process sequences 700 and 800 is in the timing of the cross-linking step. In process sequence 700, the cross-linking step 770 is performed only once for the complete layer. In process sequence 800, cross-linking is performed for each partial layer after the step of removing the porogens, so that the next partial layer (or sub-layer) is deposited onto a low porogen containing cross-linked sub-layer. One advantage of process sequence 800 over a process sequence 700 is that sequential depositing, treating to remove porogens, and cross-linking produces sub-layers into which porogen byproducts from subsequent sub-layers may not easily diffuse into during processing. Thus a process sequence 800 can produce a lower-k, higher strength layer. One preferred embodiment for performing a process sequence 800 is a PECVD chamber configured for both removing porogens and for cross-linking, which can improve process throughput.

Although a number of embodiments which incorporate the teachings of the present invention have been shown and described in detail, those skilled in the art can readily devise many other varied embodiments that still incorporate these teachings.

What is claimed is:

1. A method for forming a low-k layer, comprising:
   forming a silicon oxycarbon layer that includes a bulk material and a porogen material;
   simultaneously exposing the formed silicon oxycarbon layer to a first amount of ultraviolet radiation and to a gas that comprises radicals, wherein the exposing the formed silicon oxycarbon layer to a first amount of ultraviolet radiation and to the gas does not substantially cause cross-linking of silicon atoms within the formed silicon oxycarbon layer; and
   exposing the formed silicon oxycarbon layer to a second amount of ultraviolet radiation after exposing the formed silicon oxycarbon layer to the gas that comprises radicals, wherein the second amount of ultraviolet radiation substantially causes cross-linking of silicon atoms within the formed silicon oxycarbon layer, and the second amount is greater than the first amount.

2. The method of claim 1, wherein the exposing the silicon oxycarbon layer to a gas further comprises flowing a gas mixture through a remote plasma source, wherein the gas mixture comprises a gas selected from a group consisting of oxygen ($O_2$), ozone ($O_3$), nitrous oxide ($N_2O$), carbon dioxide ($CO_2$), helium (He), nitrogen ($N_2$), argon (Ar), ammonia ($NH_3$), hydrogen ($H_2$), water vapor ($H_2O$) and methane ($CH_4$).

3. The method of claim 1, wherein the gas comprises a gas selected from a group consisting of oxygen ($O_2$), ozone ($O_3$), nitrous oxide ($N_2O$), carbon dioxide ($CO_2$), helium (He), nitrogen ($N_2$), argon (Ar), ammonia ($NH_3$), hydrogen ($H_2$), water vapor ($H_2O$) and methane ($CH_4$).

4. The method of claim 1, wherein the step of exposing the formed silicon oxycarbon layer to ultraviolet radiation and to the gas does not substantially cause cross-linking of silicon atoms within the formed silicon oxycarbon layer as compared to the step of exposing the formed silicon oxycarbon layer to the amount of energy.

5. The method of claim 1, wherein the exposing the formed silicon oxycarbon layer to ultraviolet radiation and to the gas causes substantial removal of CH and $CH_2$ groups and does not cause substantial removal of $CH_3$ bonds formed on the silicon atoms in the silicon oxycarbon layer.

6. The method of claim 1, wherein the exposing the formed silicon oxycarbon layer to the amount of energy causes cross-linking of the layer's silicon atoms to adjacent oxygen atoms to form Si—O—Si bonds.

7. A method for forming a low-k layer, comprising:
   forming a first silicon oxycarbon layer that comprises a bulk material and a porogen material;
   exposing the formed first silicon oxycarbon layer to a first gas that comprises radicals;
   forming a second silicon oxycarbon layer that comprises the bulk material and the porogen material on the first silicon oxycarbon layer, wherein the formed second silicon oxycarbon layer is in direct contact with the formed first silicon oxycarbon layer;
   exposing the formed second silicon oxycarbon layer to a second gas that comprises radicals; and
   exposing the formed first and second silicon oxycarbon layers to an amount of energy, wherein the amount of energy cures the formed first and second silicon oxycarbon layer.

8. The method of claim 7, wherein the first and the second gas each comprise a gas selected from a group consisting of oxygen ($O_2$), ozone ($O_3$), nitrous oxide ($N_2O$), carbon dioxide ($CO_2$), helium (He), nitrogen ($N_2$), argon (Ar), ammonia ($NH_3$), hydrogen ($H_2$), water vapor ($H_2O$) and methane ($CH_4$).

9. The method of claim 7, wherein the forming the first silicon oxycarbon layer, exposing the formed first silicon oxycarbon layer to the first gas, forming the second silicon oxycarbon layer, and exposing the formed second silicon oxycarbon layer to the second gas is all performed within a chemical vapor depositing chamber.

10. The method of claim 7, wherein the method produces a surface molecular terminating layer comprising —$CH_3$ molecules.

11. The method of claim 7, wherein exposing the formed first silicon oxycarbon layer to the first gas further comprises delivering ultraviolet radiation to assist the formation of the radicals at the surface of the first silicon oxycarbon layer.

12. The method of claim 7, wherein the low-k layer comprises a single silicon oxycarbon layer that comprises a plurality of formed sub-layers, wherein the plurality of formed sub-layers comprise the formed first silicon oxycarbon layer in direct contact with the formed second silicon oxycarbon layer.

13. A method for forming a low-k layer, comprising:
   forming a first silicon oxycarbon layer that comprises a bulk material and a porogen material;
   exposing the formed first silicon oxycarbon layer to a first gas that comprises radicals;
   exposing the formed first silicon oxycarbon layer to an amount of energy after exposing the formed first silicon oxycarbon layer to the radicals, wherein the amount of energy cures the formed first silicon oxycarbon layer,
   forming a second silicon oxycarbon layer that comprises the bulk material and the porogen material on the first silicon oxycarbon layer after exposing the formed first silicon oxycarbon layer to the amount of energy, wherein the formed second silicon oxycarbon layer is in direct contact with the formed first silicon oxycarbon layer;
   exposing the formed second silicon oxycarbon layer to a second gas that comprises radicals; and exposing the formed second silicon oxycarbon layer to an amount of energy, wherein the amount of energy cures the formed second silicon oxycarbon layer.

14. The method of claim 13, wherein the first and the second gas each comprise a gas selected from a group consisting of oxygen ($O_2$), ozone ($O_3$), nitrous oxide ($N_2O$), carbon dioxide ($CO_2$), helium (He), nitrogen ($N_2$), argon (Ar), ammonia ($NH_3$), hydrogen ($H_2$), water vapor ($H_2O$) and methane ($CH_4$).

15. The method of claim 13, wherein the forming the first silicon oxycarbon layer, exposing the formed first silicon oxycarbon layer to the first gas, forming the second silicon oxycarbon layer, and exposing the formed second silicon oxycarbon layer to the second gas is all performed within a chemical vapor depositing chamber.

16. The method of claim 13, wherein the method produces a surface molecular terminating layer comprising $CH_3$ molecules.

17. The method of claim 13, wherein exposing the formed first silicon oxycarbon layer to the first gas further comprises delivering ultraviolet radiation to assist the formation of the radicals at the surface of the first silicon oxycarbon layer.

18. The method of claim 13, wherein the low-k layer comprises a single silicon oxycarbon layer that comprises a plurality of formed sub-layers, wherein the plurality of formed sub-layers comprise the formed first silicon oxycarbon layer in direct contact with the formed second silicon oxycarbon layer.

* * * * *